(12) United States Patent
Ruppi

(10) Patent No.: US 7,923,101 B2
(45) Date of Patent: Apr. 12, 2011

(54) TEXTURE-HARDENED ALPHA-ALUMINA COATED TOOL

(75) Inventor: Sakari Ruppi, Fagersta (SE)

(73) Assignee: Seco Tools AB, Fagersta (SE)

( * ) Notice: Subject to any disclaimer, the term of this patent is extended or adjusted under 35 U.S.C. 154(b) by 582 days.

(21) Appl. No.: 12/021,839

(22) Filed: Jan. 29, 2008

(65) Prior Publication Data

US 2008/0187774 A1 Aug. 7, 2008

(30) Foreign Application Priority Data

Feb. 1, 2007 (SE) .................................. 0700251

(51) Int. Cl.
*B32B 9/00* (2006.01)

(52) U.S. Cl. ............ 428/216; 51/307; 51/309; 428/325; 428/336; 428/472; 428/697; 428/698; 428/699; 428/701; 428/702

(58) Field of Classification Search ............ 51/307, 51/309; 428/216, 325, 336, 469, 472, 697, 428/698, 699, 701, 702
See application file for complete search history.

(56) References Cited

U.S. PATENT DOCUMENTS

| | | | |
|---|---|---|---|
| 4,277,283 A | 7/1981 | Tobioka et al. | ............... 75/238 |
| 4,548,786 A * | 10/1985 | Yohe | ............................. 75/244 |
| 4,610,931 A | 9/1986 | Nemeth et al. | ............... 428/547 |
| 4,830,930 A | 5/1989 | Taniguchi et al. | ............ 428/547 |
| 5,106,674 A | 4/1992 | Okada et al. | ................. 429/713 |
| 5,137,774 A | 8/1992 | Ruppi | ............................ 428/216 |
| 5,654,035 A | 8/1997 | Ljungberg et al. | ......... 427/255.3 |
| 5,863,640 A | 1/1999 | Ljungberg et al. | ............ 428/216 |
| 5,980,988 A | 11/1999 | Ljungberg | ............... 427/255.19 |
| 6,200,671 B1 * | 3/2001 | Lindskog et al. | ............. 428/702 |
| 6,333,103 B1 | 12/2001 | Ishii et al. | ...................... 428/325 |

(Continued)

FOREIGN PATENT DOCUMENTS

JP 2004-299021 * 10/2004
(Continued)

OTHER PUBLICATIONS

Osada et al "Wear mechanism of t5hermally transformed CVD Al2O3 layer" iner. Jour. of Reftr. Met. & Hard Matl 24 (2006) p. 387-391.*

*Primary Examiner* — Archene Turner
(74) *Attorney, Agent, or Firm* — Young & Thompson

(57) ABSTRACT

The present invention relates to a coated cutting tool insert and a texture-hardened $\alpha$-$Al_2O_3$ layer to be used in metal machining. The alumina layer is characterized by the improved toughness and it adheres to the substrate covering all functional parts thereof. The coating is composed of one or more refractory layers of which at least one layer is a texture-hardened $\alpha$-$Al_2O_3$ having a thickness ranging from 2 to 20 µm being composed of columnar grains with a length/width ratio of 2 to 12. The $\alpha$-$Al_2O_3$ exhibits a strong (0006) diffraction peak. The improved wear resistance and toughness can be obtained when the texture coefficient (TC) for the (0006) reflection is larger than 1.33 ln h+2, where h is the $\alpha$-$Al_2O_3$ layer thickness and when the surface of the $\alpha$-$Al_2O_3$ layer is wet-blasted to an $R_a$-value <1 µm. The alumina layer with a strong (0001) texture is applied on Binder phase enriched cemented carbide substrates. This combination contributes to enhanced wear resistance and toughness.

20 Claims, 5 Drawing Sheets

U.S. PATENT DOCUMENTS

| | | | | |
|---|---|---|---|---|
| 6,344,264 | B1 * | 2/2002 | Lenander et al. | 428/698 |
| 6,692,822 | B2 * | 2/2004 | Andersson et al. | 428/701 |
| 6,733,874 | B2 * | 5/2004 | Ueda et al. | 428/216 |
| 6,869,668 | B2 | 3/2005 | Mårtensson | 428/216 |
| 7,094,447 | B2 | 8/2006 | Ruppi | 427/419.7 |
| 2006/0141271 | A1 | 6/2006 | Ruppi | 428/457 |
| 2006/0199026 | A1 | 9/2006 | Ruppi | 428/472 |
| 2007/0104945 | A1 | 5/2007 | Ruppi | 428/337 |

FOREIGN PATENT DOCUMENTS

| | | | |
|---|---|---|---|
| JP | 2005-238437 | * | 9/2005 |
| JP | 2005-313242 | * | 10/2005 |

* cited by examiner

TEXTURE-HARDENED ALPHA-ALUMINA COATED TOOL

CROSS REFERENCE TO RELATED APPLICATIONS

This application claims priority to Swedish Patent Application 0700251-2 filed Feb. 1, 2007, the entire disclosure of which is incorporated herein by reference.

FIELD OF THE INVENTION

The present invention relates to a coated cemented carbide insert combining a substrate with a tough surface zone and a texture-hardened $\alpha$-$Al_2O_3$ layer useful in a wide range of metal cutting operations, for example turning of steel (low alloyed steel and hardened steel) and cast irons, particularly nodular cast iron in a wide range of cutting applications where the mechanical constraints may vary significantly.

BACKGROUND OF THE INVENTION

The control of the $\alpha$-$Al_2O_3$ polymorph in industrial scale was achieved in the beginning of the 1990's with commercial products based on U.S. Pat. No. 5,137,774. Later modifications of this patent have been used to deposit $\alpha$-$Al_2O_3$ with preferred textures. In U.S. Pat. No. 5,654,035 an alumina layer with the (10$\bar{1}$2) texture and in U.S. Pat. No. 5,980,988 an alumina layer with the (11$\bar{2}$0) texture are disclosed. In U.S. Pat. No. 5,863,640 the (10$\bar{1}$2), (10$\bar{1}$4) and (11$\bar{2}$0) textures are disclosed. U.S. Pat. No. 6,333,103 describes a modified method to control the nucleation and growth of $\alpha$-$Al_2O_3$ on the (10$\bar{1}$(10)) plane. U.S. Pat. No. 6,869,668 describes a method to obtain a strong (10$\bar{1}$0) texture in $\alpha$-$Al_2O_3$ using a texture modifying agent ($ZrCl_4$). The prior-art processes discussed above use all deposition temperatures of about 1000° C. U.S. Pat. No. 7,094,447 describes a technique to achieve a pronounced (10$\bar{1}$2) texture. Enhanced deposition techniques to produce pronounced (10$\bar{1}$4) and (11$\bar{2}$6) textures are disclosed in US2006/0199026 and US 2006/0141271, respectively. However, the (0006) diffraction peak, which is an indication of the (0001) texture, has not been observed earlier. In US 2007/104945 a (0001) textured alumina layer is disclosed. The (10$\bar{1}$2), (10$\bar{1}$4) and (0001) textured alumina layers are compared and the (0001) texture is found superior to the other textures.

Methods to produce a tough binder phase enriched surface zone in the upper part of cemented carbide cutting tool inserts prior to coating are commonly referred to as gradient sintering. There are two types of processes used to produce the binder phase enriched surface zone:
(i) By dissolution of cubic carbide phase near the surface (N-gradient), e.g., U.S. Pat. Nos. 4,277,283, 4,610,931, 4,830,930 and 5,106,674.
(ii) By controlled cooling or decarburisation (C-gradient), e.g., U.S. Pat. No. 5,106,674 and U.S. Pat. No. 4,830,930

New laws/regulations will increase the cost of the use of cooling lubricants in metals machining. This promotes dry machining. In turn, this will increase the demand for more temperature-resistant coated cemented carbides and generally forces the metal cutting industry to consider new alternative methods. The following are the most important trends in the market place:
Higher cutting speeds, for increased productivity.
Dry machining and/or Minimal Quantity of Lubrication (MQL), for reduced costs and environmental aspects.
Difficult-to-machine materials, i.e., high strength materials, for lighter components and constructions.

All these trends put more demands on wear resistance, together with deformation resistance and toughness. Due to its high chemical stability and favourable thermal properties $Al_2O_3$ is the ideal coating material for high-speed metal cutting. Due to the trends in the market place discussed above the need for enhanced wear resistance together with enhanced toughness is highlighted.

The present invention is directed to these and other important needs, including providing an improved alumina coated cemented carbide tool with improved on wear resistance, together with deformation resistance and toughness.

SUMMARY OF THE INVENTION

In one aspect, the invention is directed to cutting tool inserts comprising a cemented carbide body and a coating,
wherein the cemented carbide body comprises:
WC;
about 4-12, preferably about 5-9, wt-% Co; and
about 5-10, preferably about 7.5-9.5, wt-% cubic carbides of at least one metal selected from the group consisting of groups IVb, Vb and VIb of the periodic table, preferably Ti, Nb and Ta;
wherein the cemented carbide body has an S-value of about 0.79-0.90 and a coercivity of about 9-18, preferably about 10-15, kA/m;
wherein at least one surface of the cemented carbide body comprises a binder phase enriched surface zone having a thickness of 5-50, preferably about 5-30, µm and being essentially free from cubic carbides adjacent the coating;
wherein the coating comprises at least one $\alpha$-$Al_2O_3$ layer, wherein the $\alpha$-$Al_2O_3$ layer is about 1-20, preferably about 2-15, µm, thick and wherein the $\alpha$-$Al_2O_3$ layer comprises columnar grains with a length/width ratio from about 2-12 whereby the $\alpha$-$Al_2O_3$ layer has a texture coefficient TC(0006) $\geq 1.33$ ln h+2
where:
h is the thickness of the $\alpha$-$Al_2O_3$-layer in µm; and
texture coefficient TC(0006) is defined as follows:

$$TC(hkil) = \frac{I(hkil)}{I_0(hkil)} \left[ \frac{1}{n} \sum_{n=1}^{n} \frac{I(hkil)}{I_0(hkil)} \right]^{-1}$$

Where:
I(hkil)=measured intensity of the (hkil) reflection;
$I_0$(hkil)=standard intensity according to Joint Committee on Powder Diffraction Standards (JCPDS) card no. 46-1212;
n=number of reflections used in the calculation;
where the (hkil) reflections used are: (10$\bar{1}$2), (10$\bar{1}$4), (11$\bar{2}$0), (0006), (11$\bar{2}$3), and (11$\bar{2}$6).

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 2b is an SEM micrograph in 10000× magnification obtained using back-scattered electrons of a polished cross-section of an as deposited α-Al$_2$O$_3$ layer according to the invention deposited onto a Ti(C,N)-layer deposited on the substrate from FIG. 2a.

DETAILED DESCRIPTION OF THE INVENTION

Figure 1:
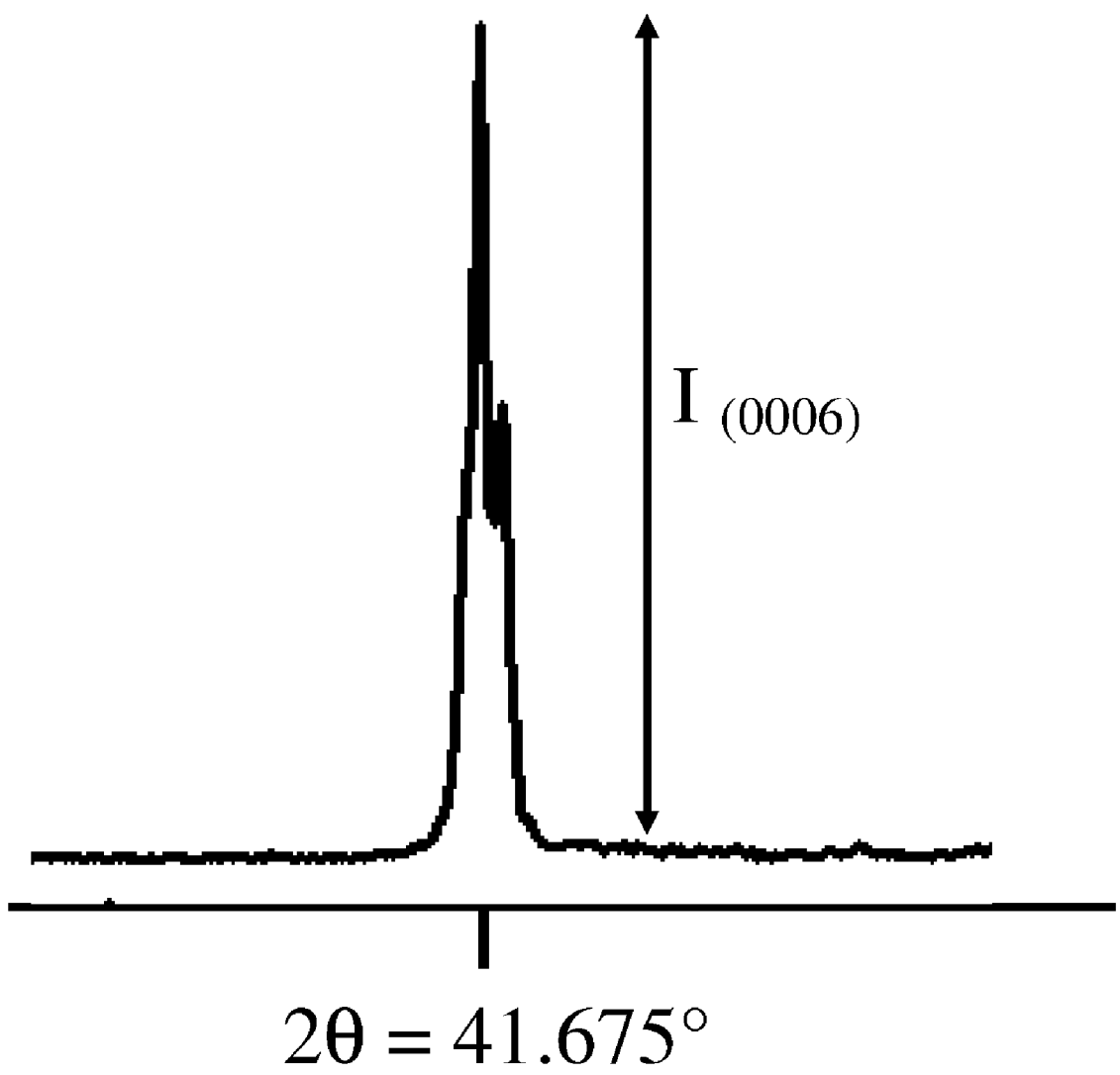
FIG. 1 shows the (0006) diffraction peak at 2θ of 41.675° obtained by using Cu $K_\alpha$ radiation from an $\alpha$-$Al_2O_3$ layer according to the present invention.

It has now surprisingly been found that the full advantage of the texture-hardening effect can be achieved in combination with a binder phase enriched substrate. When applied on such a cemented carbide the (0001) texture-hardened α-Al$_2$O$_3$ clearly outperforms the prior art. The effect of the cobalt enrichment is strengthened by the presence of the (0001) texture. Another surprising effect is that the (0001) texture clearly reduces the tendency for plastic deformation of the cutting edge.

Thus, the present invention combines a cemented carbide with binder phase enriched surface zone with a texture-hardened α-Al$_2$O$_3$ layer. A cutting tool insert is provided comprising:

a) Bulk Substrate

According to the present invention a coated cutting tool insert is provided consisting of a cemented carbide body with a composition of 4-12, preferably 5-9, most preferably 6-7, wt-% Co and about 5-10, preferably about 7.5-9.5 wt-% cubic carbides of the metals from groups IVb, Vb and VIb of the periodic table, preferably Ti, Nb and Ta, and balance WC, preferably about 83-87 wt-% WC. The ratio between the weight concentrations of Ta and Nb is between about 1.0-3.0, preferably about 1.5-2 and of Ti and Nb, between about 0.5-2.0, preferably about 0.8-1.2.

The cobalt binder phase is preferably highly alloyed with tungsten. The concentration of W in the binder phase may be expressed as the S-value=σ/16.1, where σ is the magnetic moment of the binder phase in μTm$^3$ kg$^{-1}$. The S-value depends on the content of tungsten in the binder phase and increases with decreasing tungsten content. Thus S=1 for pure cobalt, or for a binder saturated with carbon. Further, it is noted that S=0.78 for a binder phase that contains W in an amount corresponding to the borderline to formation of η-phase. S should be slightly above the borderline value of 0.78, preferably within the range 0.79-0.90, most preferably 0.80-0.85.

The mean WC grain size expressed as coercivity is 9-18, preferably 10-15, most preferably 11-13 kA/m.

b) Cobalt Enrichment

The thickness of the binder phase enriched layer in the surface region of the cemented carbide bulk is 5-50, preferably 10-30, most preferably 15-25 μm. It has an average binder phase content in the range of 1.2-2.5 times that of the nominal binder phase content of the bulk and it is essentially free from cubic carbides.

c) α-Al$_2$O$_3$ Layer

The coating is composed of one or more refractory layers of which at least one layer is a texture-hardened α-Al$_2$O$_3$. The thickness of the α-Al$_2$O$_3$ layer is from about 1 to 20, preferably about 2-15, more preferably about 4-12 and most preferably about 4-7 μm. The α-Al$_2$O$_3$ layer is composed of columnar grains with a strong (0001) texture. The length/width ratio of the alumina grains is from about 2-12, preferably about 2-10, being dependent on the thickness of the layer. The α-Al$_2$O$_3$ layer is characterised by a (0006) diffraction peak at 2θ=41.675° when Cu K$_α$ radiation is used. The other common diffraction peaks, such as (10$\bar{1}$2), (10$\bar{1}$4), (11$\bar{2}$0), (11$\bar{2}$3), (11$\bar{2}$6) and (30$\bar{3}$0) show low intensity. The texture coefficient (TC) for the alumina layer is determined according to the following formula:

$$TC(hkil) = \frac{I(hkil)}{I_0(hkil)} \left[ \frac{1}{n} \sum_{n=1}^{n} \frac{I(hkil)}{I_0(hkil)} \right]^{-1} \quad (1)$$

where
I(hkil)=intensity of the (hkil) reflection
I$_O$(hkil)=standard intensity according to JCPDS card no 46-1212
n=number of reflections used in the calculation
(hkil) reflections used are: (10$\bar{1}$2), (10$\bar{1}$4), (11$\bar{2}$0), (0006), (11$\bar{2}$3), (11$\bar{2}$6).

Consequently, n=6 and the maximum value of the texture coefficient is 6.

When TC values for the TC(0006) reflection were measured for a large number of alumina layers and the obtained values were expressed as a function of the thickness of the layers the following curve could be fitted with the experimental data and, consequently, the preferred TC(0006) values can be expressed as follows:

$$TC(0006) \geq 1.33 \ln h + 2, h \epsilon [1.20]. \quad (2)$$

Equation 2 represents the lowest TC(0006) values obtained from the experimental layers varying in thickness, h, from about 1 to 20 μm. It is pointed out that better performance is obtained if the TC(0006) is higher than given by equation (2). For example, TC(0006) values larger than 4, preferably larger than 5, are preferred when the thickness, h, is ≧4 μm. The cutting tests clearly indicate that enhanced performance is obtained when TC(0006)≧5. These circumstances can be obtained when the CVD process is properly controlled with respect nucleation and growth. It is further noted, as clear from Equation 2, that the intensity of the (0006) peak and the TC(0006) are generally higher the thicker the CVD layer is, again on the condition that the CVD process is properly controlled. TC(0006)>about 3, preferably >about 4, is acceptable for relatively thin alumina layers, less than about 4 μm. The texture-hardened CVD alumina layer is under a tensile residual stress of about 0.5-1.0 GPa. It is emphasized that the α-Al$_2$O$_3$ layer according to the present invention concerns as-deposited α-Al$_2$O$_3$.

The α-Al$_2$O$_3$ layer is further characterised by a shiny, preferably black, surface finish, which can be obtained by wet-blasting using an Al$_2$O$_3$ slurry. The surface roughness expressed as R$_a$ should be <about 1.0 μm, preferably <about 0.7 μm, most preferably <about 0.5 μm.

d) Coating

The coating according to the present invention comprises a first layer adjacent the substrate of CVD Ti(C,N), CVD TiN, CVD TiC, MTCVD Ti(C,N), MTCVD Zr(C,N), MTCVD Ti(B,C,N), CVD HfN or combinations thereof preferably of Ti(C,N) having a thickness of from 1 to 20, preferably from 5 to 10, most preferably 5 to 8, μm. Said first layer is terminated by a bonding layer about 0.5-1 μm thick of (Ti,Al)(C,O,N) preferably with increasing aluminium content towards the outer surface. Preferably, there is an intermediate layer of TiN between the substrate and said first layer with a thickness of <about 3 μm, preferably about 0.5-2 μm.

In one embodiment the texture-hardened $\alpha$-$Al_2O_3$ layer described above is the uppermost layer. In another embodiment there is a layer of carbide, nitride, carbonitride or carboxynitride of one or more of Ti, Zr and Hf, having a thickness of from about 0.5-3 μm, preferably 0.5 to 1.5 μm atop the texture-hardened $\alpha$-$Al_2O_3$ layer described above. Also in this case the coating surface has a surface roughness measured as $R_a$ as above.

e) Preferred Embodiments

In one preferred embodiment the cutting tool insert has a composition of about 6-9 wt-% Co and about 6.5-9.5 wt-% cubic carbides of the metals from groups IVB, VB and VIb of the periodic table wherein the uppermost layer is about 4-7 μm thick, wet-blasted ($R_a$<1 μm), $\alpha$-$Al_2O_3$ layer composed of columnar grains with a length/width ratio from 2 to 15 and TC(0006)≧4.5. The coating further comprises a first layer adjacent the cemented carbide substrate being comprised of CVD Ti(C,N), CVD TiN, CVD TiC, MTCVD Ti(C,N), MTCVD Ti(C,O,N), MTCVD (Ti,Al)(C,O,N) or combinations thereof, preferably of Ti(C,N) having a thickness of from about 4-10 μm, preferably from about 5-7 μm.

In another preferred embodiment the cutting tool insert has a composition of about 4-6 wt-% Co and about 5-10 wt-% cubic carbides of the metals from groups IVB, VB and VIB of the periodic table wherein the uppermost layer is an about 6-15 μm thick, wet-blasted ($R_a$<1 μm), $\alpha$-$Al_2O_3$ layer composed of columnar grains with a length/width ratio from about 2-20 and TC(0006)≧about 5.0. The coating further comprises a first layer adjacent the cemented carbide substrate being comprised of CVD Ti(C,N), CVD TiN, CVD TiC, MTCVD Ti(C,N), MTCVD Ti(C,O,N), MTCVD (Ti, Al)(C,O,N) or combinations thereof, preferably of Ti(C,N) having a thickness of from about 4-15 μm, preferably from about 5-10 μm.

f) Method

The invention also relates to methods of making cutting tool inserts according to the description comprising a cemented carbide substrate consisting of a binder phase of Co, WC and a cubic carbonitride phase with a binder phase enriched surface zone essentially free of cubic phase and a coating. A powder mixture containing about 4-9, preferably about 5-8, most preferably about 6-7 wt-% Co, and about 6-10, preferably about 6.5-9.5, most preferably about 7.5-9 wt-% cubic carbides of the metals from groups IVB, VB and VIB of the periodic table, preferably Ti, Nb and Ta, and balance WC, preferably about 84-88 wt-% WC. The ratio between the weight concentrations of Ta and Nb is within about 1.0-3.0, preferably about 1.5-2. The ratio between the weight concentrations of Ti and Nb is within about 0.5-1.5, preferably about 0.8-1.2. Well-controlled amounts of nitrogen are added through the powder e.g. as nitrides or by performing an in-situ nitriding in the furnace using e.g. nitrogen gas. The optimum amount of nitrogen to be added depends on the composition of the cemented carbide and in particular on the amount of cubic phases. The exact conditions depend to a certain extent on the design of the sintering equipment being used. It is within the purview of the skilled artisan to determine and to modify the nitrogen addition and the sintering process in accordance with the present specification in order to obtain the desired result.

The powder materials are mixed with pressing agent and tungsten or carbon in such a way that the desired S-value is obtained and the mixture is wet milled and spray dried to obtain a powder material with the desired properties. The powder is then compacted and sintered. Sintering is performed at a temperature of about 1300-1500° C., in a controlled atmosphere of about 50 mbar followed by cooling.

After conventional post sintering treatments including edge rounding, a coating is applied using CVD and MTCVD techniques. The first layer is MTCVD Ti(C,N), optionally containing a thin, thickness <about 3 μm, preferably about 0.5-2.0 μm TiN layer adjacent the substrate and additionally another optional TiN layer, thickness <about 3 μm, preferably about 0.5-2.0 μm situated about 0.5-2.5 μm below the alumina-Ti(C,N) interface.

The present invention also relates to a refined method to produce textured $\alpha$-$Al_2O_3$ layers in a temperature range of about 850-1050° C., preferably at about 900-1000° C. with a (0001) texture. The $\alpha$-$Al_2O_3$ layer is deposited on a bonding layer of (Ti,Al)(C,O,N) preferably with increasing aluminium content towards the outer surface. Onto this layer a Ti(C,O) layer is deposited with controlled O-content. A nucleation layer is obtained in the similar way as used in ALD (Atomic Layer Deposition). The procedure is as follows:

(i) exposure of a first precursor $TiCl_4$, preferably together with $AlCl_3$,
(ii) purge ($N_2$),
(iii) exposure of the second precursor ($H_2O$) and
(iv) purge ($N_2$).

The duration of the steps (i) and (iii) is about 1-5 min, preferably about 2 min each and the steps (ii) and (iv) about 2-10 min, preferably about 5 min each. The deposition of the $\alpha$-$Al_2O_3$ is started with a relatively long about 30-120 min, preferably about 60 min, nucleation step without sulphur- or fluorine-containing compounds. $\alpha$-$Al_2O_3$ is grown to its desired thickness using sulphur-containing compounds $H_2S$, or $SO_2$, preferably $H_2S$, optionally together with fluorine-containing compounds $SF_6$ or HF, preferably $SF_6$. When $\alpha$-$Al_2O_3$ is nucleated correctly, followed by a deposition process using relatively low amounts of these dopants together with a $CO+CO_2$ gas mixture, where CO=2.5-5.5×$CO_2$, a stronger (0001) growth texture than known from the prior art can be obtained in a controlled way. Important difference compared with the prior-art is that the texture is controlled, in addition to the nucleation procedure, also during the growth of $\alpha$-$Al_2O_3$ itself. The $CO/CO_2$ ratio is gradually increased from 2.5 to 5.5 during the CVD process to maintain the preferred growth direction. Consequently, the (0001) texture is stronger and the surface microstructure of the alumina layer differs from that known earlier being terminated by (10$\bar{1}$2) and (10$\bar{1}$4) surfaces. The described texture cannot be obtained unless both the nucleation and growth are controlled correctly. This is a possible explanation for the fact that the (0001) texture [(0006) diffraction peak)] has been unknown so far.

After the coating operation the outermost layer is smoothed to obtain a shiny, preferably black, surface finish with a surface roughness expressed as $R_a$ of <about 1.0 μm, preferably <about 0.7 μm, most preferably <about 0.5 μm which can be obtained by wet-blasting using an $Al_2O_3$ slurry. The average roughness ($R_a$) value can easily be controlled by wet-blasting data. e.g. pressure and time. There are naturally several other possible surface treatments, which can also be applied.

The present invention is further defined in the following Examples, in which all parts and percentages are by weight, unless otherwise stated. It should be understood that these examples, while indicating preferred embodiments of the invention, are given by way of illustration only. From the above discussion and these examples, one skilled in the art can ascertain the essential characteristics of this invention, and without departing from the spirit and scope thereof, can make various changes and modifications of the invention to adapt it to various usages and conditions.

EXAMPLES

Example 1

Figure 2A:
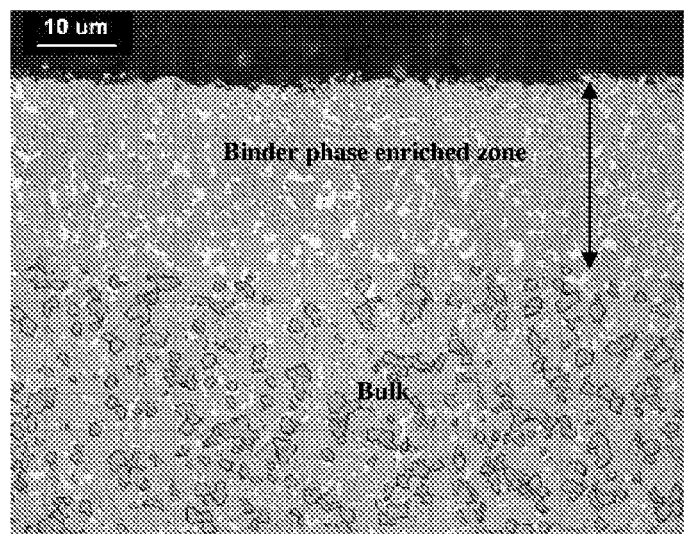
FIG. 2a is a light optical micrograph in 1200× magnification of an uncoated polished cross section of the surface zone of a cemented carbide with an N-gradient. The white phase is binder phase, the light grey is WC and the dark grey is cubic phase.
Figure 2B:
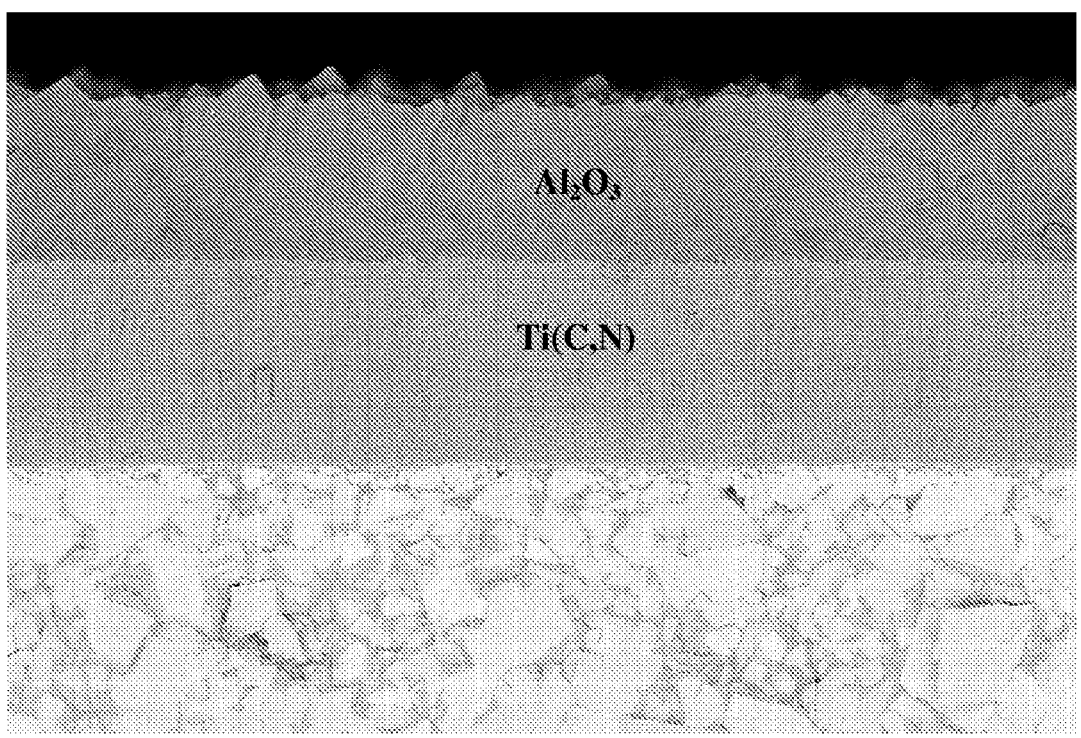

Cemented carbide inserts of type CNMG120408-M5 and SNUN120408 with a composition of 6.6 wt % Co, 3.6 wt % TaC, 2.2 wt % NbC, 2.5 wt % TiC and balance WC, with a binder phase alloyed with W corresponding to an S-value of 0.83 were produced by conventional milling of the raw material powders, pressing of the green compacts and subsequent sintering at 1430° C. The nitrogen was added to the carbide powder as Ti(C,N). A microstructural investigation after sintering showed that a cubic carbide free zone with a thickness of about 20 μm was formed (FIG. 2a). The coercivity was 11.8 kA/m corresponding to an average grain size of about 1 μm. This substrate is referred to as "substrate A".

Example 2

Comparative Example

From a similar powder mixture as used in Example 1, but without nitrogen additions, inserts of type CNMG120408-M5 and SNUN120408 were pressed and sintered according to a standard procedure. The inserts were examined and they did not exhibit any Co-enrichment. The average grain size was the same as in Example 1. This substrate is referred to as "substrate B".

Example 3

Cemented carbide cutting inserts from Examples 1 and 2 were coated with a layer of MTCVD Ti(C,N). The thickness of the MTCVD layer was about 6 μm. On to this layer four α-Al$_2$O$_3$ layers consisting of about 6 μm α-Al$_2$O$_3$ were deposited:
a) (10$\bar{1}$2) textured α-Al$_2$O$_3$ (according to prior art),
b) (10$\bar{1}$4) textured α-Al$_2$O$_3$ (according to prior art),
c) (0001) textured α-Al$_2$O$_3$ (invention) and
d) (0001) textured α-Al$_2$O$_3$ according to prior art US 2007/104945.

The layers will be referred to as layers a, b, c and d. For example, substrate A with layer a is referred to as Aa. Layer c was deposited according to the invention. Layer d was deposited using the prior-art process. The process used for layer c resulted in a stronger growth along the [0001] direction and the surfaces of the α-Al$_2$O$_3$ grains of this layer were not terminated by the (0001) surfaces (invention).

Figure 3:
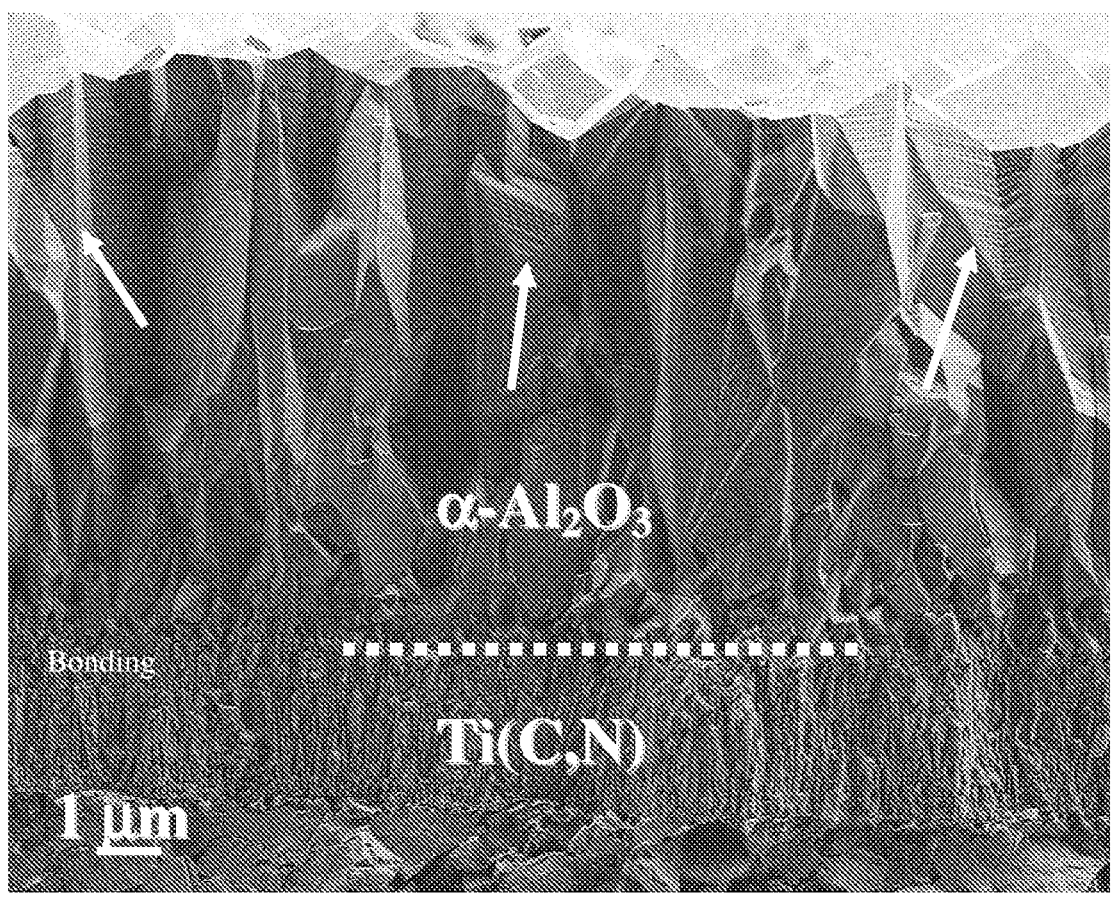
FIG. 3 shows a cross-section SEM micrograph of the texture-hardened α-Al$_2$O$_3$ layer according to the present invention, coating c from Example 3. The (0001) planes, which are nearly parallel to the coating surface, are arrowed.
Figure 4A:
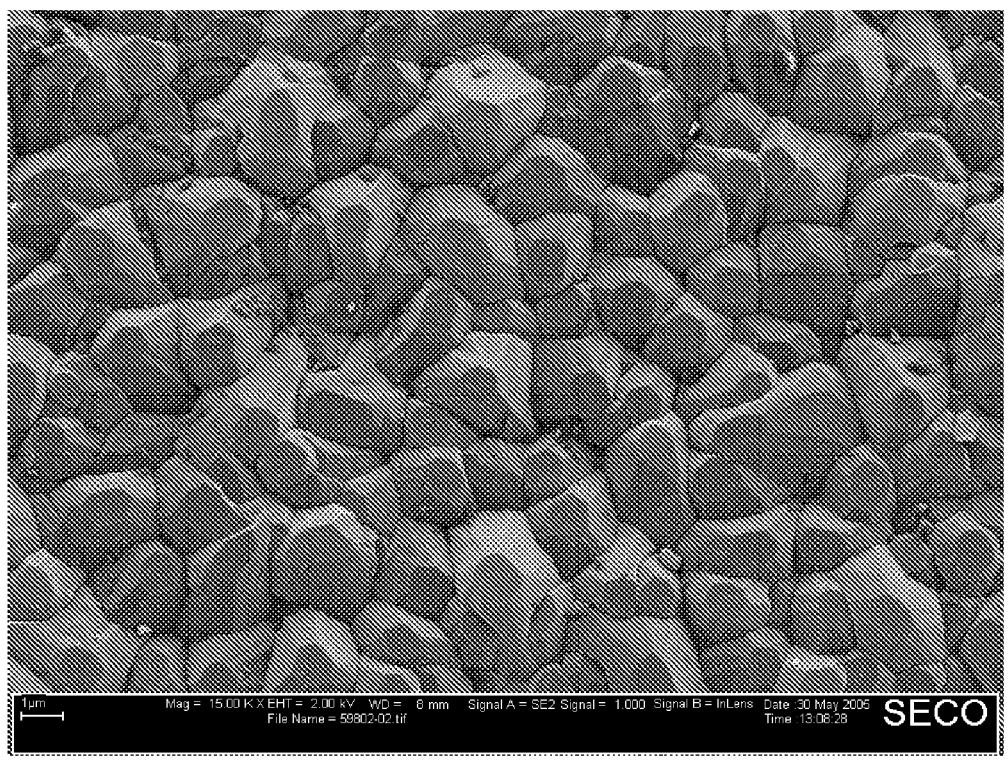
FIG. 4a is not terminated by (0001) planes, as is the layer according to the prior art, layer d, FIG. 4b.
Figure 4B:
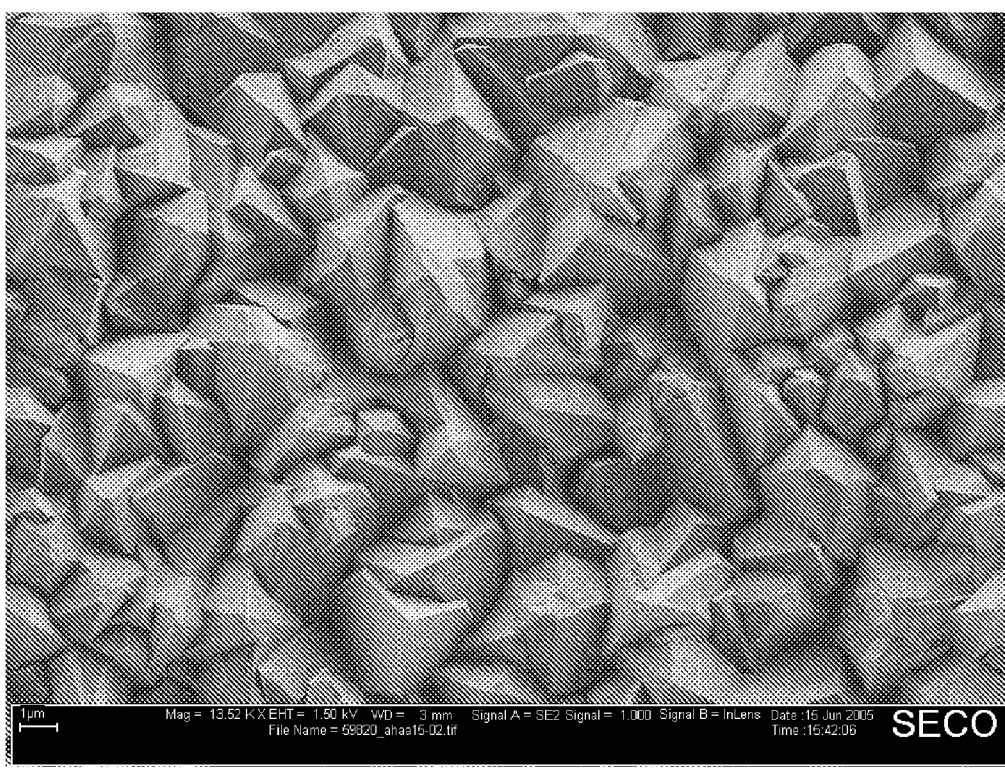
FIG. 4 shows SEM surface images of (0001) textured α-Al$_2$O$_3$ layers c and d from Example 3, respectively. The layer according to the invention, layer c.

The coated tools were wet-blasted using alumina particles to an Ra value of less than 0.8 μm. FIG. 3 shows a cross-section SEM micrograph of layer c before wet blasting. The alumina layer is composed of columnar grains with (0001) planes parallel to the substrate surface (arrowed). FIG. 4 shows SEM surface images of layers c and d demonstrating the above-discussed differences in the surface morphologies.

Example 4

Figure 5:
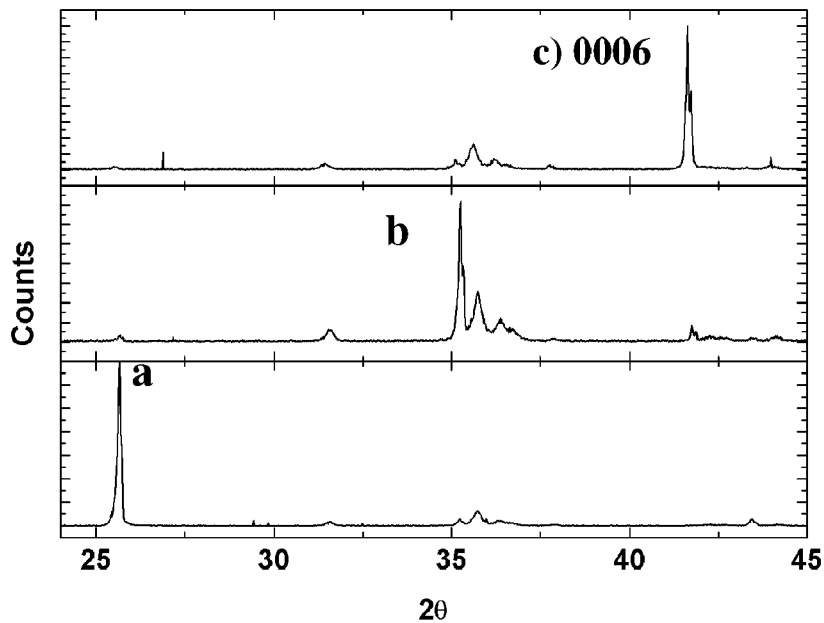
FIG. 5 shows X-ray Diffraction (XRD) patterns of the α-Al$_2$O$_3$ layers a, b and c from Example 4 (2θ=25-45°).

Layers a), b), c) and d) were studied using X-ray diffraction. The-ray diffraction patterns are presented in FIG. 5. The absence of the (0006) diffraction peaks on layers a) and b) should be noticed. TC(10$\bar{1}$2), TC(10$\bar{1}$4) and TC(0006) were determined. The results are presented in Table 1. Note that two different (0001) textured alumina layers were produced (layers c and d with strong (0006) diffraction peaks). Layer c is according to the invention.

TABLE 1

| Layer | Peak indices (hkil) | TC (hkil) |
|---|---|---|
| a | (10$\bar{1}$2) | 5.16 |
| b | (10$\bar{1}$4) | 4.23 |
| c | (0006) | 5.55 (invention) |
| d | (0006) | 4.02 (prior-art) |

Example 5

60 cemented carbide cutting inserts from Example 1 were coated with a layer of MTCVD Ti(C,N). Ten inserts of these were coated with α-Al$_2$O$_3$ alumina layers according to the present invention with following thicknesses: 2, 4, 6, 8, 10 and 15 μm (10 inserts/thickness). The alumina layers were deposited using identical processes. Diffraction peak intensities were determined by XRD and TC values were obtained by using Equation 1. The results are given in Table 2.

TABLE 2

| Layer thickness (μm) | TC (average of 10 inserts) |
|---|---|
| 2 | 3.4 ± 0.4 |
| 4 | 4.9 ± 0.6 |
| 6 | 5.2 ± 0.5 |
| 8 | 5.4 ± 0.4 |
| 10 | 5.5 ± 0.4 |
| 15 | 5.7 ± 0.2 |

Example 6

Layers a), b) and c) deposited on the binder phase enriched substrates from Example 1 were evaluated using a slotted bar test under the following conditions.
Work piece: Cylindrical slotted bar
Material: SS1672
Insert type: CNMG120408-M5
Cutting speed: 130 m/min
Feed: 0.1, 0.125, 0.16, 0.20, 0.25, 0.315, 0.4, 0.5, 0.63, 0.8 and 1.0 mm/rev gradually increased after 10 mm length of cut
Depth of cut: 2.0 mm
Remarks: dry turning
Tool life criteria: Gradually increased feed until edge breakage. Ten edges of each variant were tested.

Figure 6:
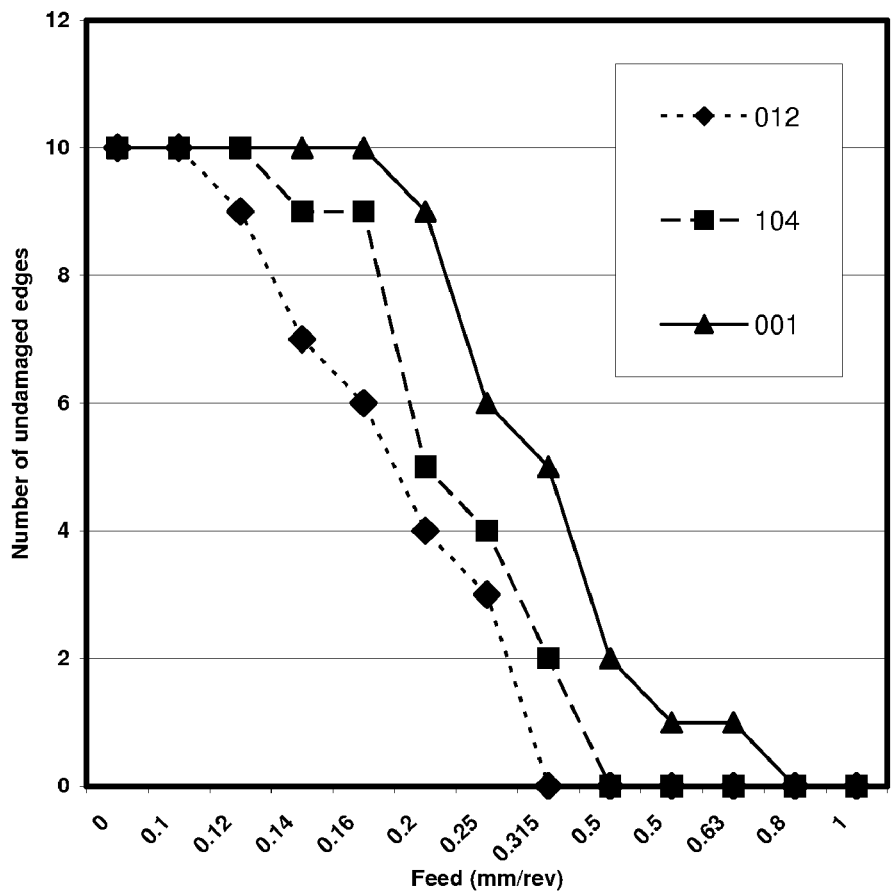
FIG. 6 shows the number of undamaged cutting edges vs. feed in mm/rev in the cutting test in Example 7.

The results are presented in FIG. 6 showing the number of the survived edges as a function of feed (mm/rev). FIG. 6 demonstrates that the layer texture is important for the properties of the tool. The (0001) texture-hardened layer outperforms the prior-art.

Example 7

The coated inserts from Examples 1-3 were tested with respect to toughness in a turning operation with interrupted cuts. The work piece material was SS2343.
Work piece: Cylindrical slotted bar
Material: SS2343
Insert type: CNMG120408-M5
Cutting speed: 70 m/min
Feed: 0.1, 0.125, 0.16, 0.20, 0.25, 0.315, 0.4, 0.5, 0.63, 0.8 and 1.0 mm/rev gradually increased after 10 mm length of cut
Depth of cut: 2.0 mm
Remarks: coolant, 15 edges of each variant were tested.
As clear from Table 3 the edge toughness was considerably enhanced when the layer was deposited according to the present invention on Binder phase enriched substrates The test results showed that the layer according to the invention (layer c) exhibited clearly better toughness behaviour than the prior-art (layers a and b) when deposited on Binder phase enriched substrate.

TABLE 3

| Substrate/Coating | Mean feed at breakage (mm) |
|---|---|
| Aa | 0.31 |
| Ab | 0.40 |
| Ac (invention) | 0.64 (+60% as compared with Ab) |
| Ad (prior art) | 0.49 (+23% as compared with Ab) |
| Ba | 0.14 |
| Bb | 0.21 |
| Bc | 0.26 (+24% as compared with Bb) |
| Bd | 0.24 (+14% as compared with Bb) |

Example 8

The layers a), b), c) and d) were tested with respect to edge chipping in longitudinal turning in cast iron. This type of cast iron, even though it is not the preferred work piece material for this type of tool, was used to evaluate the edge-chipping tendency of the alumina layers.
Work piece: Cylindrical bar
Material: SS0130
Insert type: SNUN 120408
Cutting speed: 220 m/min
Feed: 0.4 mm/rev
Depth of cut: 2.0 mm
Remarks: dry turning
The inserts were inspected after 2 and 6 minutes of cutting. As clear from Table 4 the edge toughness of the prior art product was considerably enhanced when the layer was produced according to the present invention.

TABLE 4

| | Flaking of the edge line (%) after 2 minutes | Flaking of the edge line (%) after 6 minutes |
|---|---|---|
| Aa | 8 | 22 |
| Ab | 6 | 17 |
| Ac (invention) | 4 | 8 |
| Ad (prior art) | 4 | 12 |

Example 9

Layers a (prior-art), c (invention) and d (prior-art) from example 3 were tested in continuous turning in ordinary carbon steel using coolant. The following cutting data were used:
Work piece: Cylindrical bar
Material: SS 1672
Inert type: SNUN 120408
Cutting speed 320 m/min
Feed: 0.4 mm/rev
Depth of cut: 2.0 mm
Tool life criterion: Flank wear>0.3 mm.
The example demonstrates that the wear resistance is higher for the alumina layer with higher TC(0006) according to the invention. The test results are summarised in Table 5.

TABLE 5

| Experimental Substrate/Coating | Tool life (min) |
|---|---|
| Coating Aa (prior-art) | 5.2 |
| Coating Ac (Invention) | 11.5 |
| Coating Ad (prior-art) | 8.2 |

When ranges are used herein for physical properties, such as molecular weight, or chemical properties, such as chemical formulae, all combinations, and subcombinations of ranges specific embodiments therein are intended to be included.

The disclosures of each patent, patent application and publication cited or described in this document are hereby incorporated herein by reference, in its entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed is:

1. A cutting tool insert comprising a cemented carbide body and a coating;
wherein the cemented carbide body comprises:
WC;
about 4-12 wt-% Co; and
about 5-10 wt-% cubic carbides of at least one metal selected from the group consisting of groups IVb, Vb and VIb of the periodic table;
wherein the cemented carbide body has an S-value of about 0.79-0.90 and a coercivity of about 9-18 kA/m;
wherein at least one surface of the cemented carbide body comprises a binder phase enriched surface zone having a thickness of about 5-50 μm and being essentially free from cubic carbides adjacent the coating;
wherein the coating comprises at least one α-Al$_2$O$_3$ layer, wherein the α-Al$_2$O$_3$ layer is about 1-20 μm thick and wherein the α-Al$_2$O$_3$ layer comprises columnar grains with a length/width ratio from about 2-12, whereby the α-Al$_2$O$_3$ layer has a texture coefficient TC(0006)≧1.33 (ln h)+2;
where:
h is the thickness of the α-Al$_2$O$_3$ layer in μm; and texture coefficient TC(0006) is defined as follows:

$$TC(hkil) = \frac{I(hkil)}{I_0(hkil)} \left[ \frac{1}{n} \sum_{n=1}^{n} \frac{I(hkil)}{I_0(hkil)} \right]^{-1}$$

where
I(hkil)=measured intensity of the (hkil) reflection;
I$_0$(hkil)=standard intensity according to JCPDS card no. 46-1212;
n=number of reflections used in the calculation where the (hkil) reflections used are: (1012), (1014), (1120), (0006), (1123), and (1126).

2. The cutting tool insert of claim 1, wherein the binder phase enriched surface zone has a thickness of about 5-30 μm;

wherein the α-Al₂O₃ layer is about 4-15 μm thick; and
wherein the α-Al₂O₃ layer has a texture coefficient TC(0006)≧about 5.

3. The cutting tool insert of claim 1,
wherein the binder phase enriched surface zone has a thickness of about 5-30 μm;
wherein the α-Al₂O₃ layer is about 1 μm to less than about 4 μm thick; and
wherein the α-Al₂O₃ layer has a texture coefficient TC(0006)≧about 4.

4. The cutting tool insert of claim 1,
wherein the coating further comprises a first layer adjacent to the body;
wherein the first layer of the coating comprises a material selected from the group consisting of CVD Ti(C,N), CVD TiN, CVD TiC, CVD HfN, MTCVD Ti(C,N), MTCVD Ti(C,O,N), MTCVD Zr(C,N), MTCVD Zr(C,O,N), MTCVD Ti(B,C,N), MTCVD (Ti,Al)(C,O,N) and combinations thereof;
wherein the first layer of the coating has a thickness of from about 1-20 μm; and
wherein the texture-hardened α-Al₂O₃ layer is adjacent the first layer.

5. The cutting tool insert of claim 1,
wherein the α-Al₂O₃ layer is the uppermost layer and has an $R_a$ value <about 1.0 μm.

6. The cutting tool insert of claim 1, further comprising:
a second layer comprising a substance selected from the group consisting of carbide, nitride, carbonitride and carboxynitride of one or more of Ti, Zr and Hf;
wherein:
the second layer has a thickness of from about 0.5-3 μm; and
the second layer is atop the α-Al₂O₃ layer.

7. The cutting tool insert of claim 6,
wherein the second layer is the uppermost layer; and
wherein the second layer has an average roughness ($R_a$) value of <about 1.0 μm.

8. A cutting tool insert, comprising a cemented carbide body and a coating;
wherein the body comprises WC, about 6-9 wt-% Co and about 6.5-9.5 wt-% cubic carbides of at least one metal selected from the group consisting of groups IVb, Vb and VIb of the periodic table;
wherein the body has an S-value of about 0.79-0.90 and a coercivity of about 9-18 kA/m;
wherein at least one surface of the body comprises a binder phase enriched surface zone having a thickness of about 5-50 μm and being essentially free from cubic carbides adjacent the coating;
wherein the coating comprises at least one α-Al₂O₃ layer;
wherein the α-Al₂O₃ layer is about 4-7 μm thick;
wherein the α-Al₂O₃ layer forms the uppermost layer;
wherein the α-Al₂O₃ layer is wet-blasted to $R_a$<about 1 μm;
wherein the α-Al₂O₃ layer comprises columnar grains with a length/width ratio from about 2-15 and TC(0006) ≧about 4.5;
wherein the coating further comprises a first layer adjacent to the body;
wherein the first layer of the coating comprises a material selected from the group consisting of CVD Ti(C,N), CVD TiN, CVD TiC, CVD HfN, MTCVD Ti(C,N), MTCVD Ti(C,O,N), MTCVD Zr(C,N), MTCVD Zr(C,O,N), MTCVD Ti(B,C,N), MTCVD (Ti,Al)(C,O,N) and combinations thereof; and
wherein the first layer of the coating has a thickness of from about 4-10 μm.

9. The cutting tool insert of claim 8,
wherein the first layer of the coating has a thickness of from about 5-7 μm.

10. A cutting tool insert, comprising a cemented carbide body and a coating;
wherein the body comprises WC, about 4-6 wt-% Co and about 5-10 wt-% cubic carbides of at least one metal selected from the group consisting of groups IVb, Vb and VIb of the periodic table;
wherein the body has an S-value of about 0.79-0.90 and a coercivity of about 9-18 kA/m;
wherein at least one surface of the body comprises a binder phase enriched surface zone having a thickness of about 5-50 μm and being essentially free from cubic carbides adjacent the coating;
wherein the coating comprises at least one α-Al₂O₃ layer;
wherein the α-Al₂O₃ layer is about 6-15 μm thick;
wherein the α-Al₂O₃ layer forms the uppermost layer;
wherein the α-Al₂O₃ layer is wet-blasted to $R_a$<about 1 μm;
wherein the α-Al₂O₃ layer comprises columnar grains with a length/width ratio from about 2-20 and TC(0006) about 5.0;
wherein the coating further comprises a first layer adjacent to the body;
wherein the first layer of the coating comprises a material selected from the group consisting of CVD Ti(C,N), CVD TiN, CVD TiC, CVD HfN, MTCVD Ti(C,N), MTCVD Ti(C,O,N), MTCVD Zr(C,N), MTCVD Zr(C,O,N), MTCVD Ti(B,C,N), MTCVD (Ti,Al)(C,O,N) and combinations thereof; and
wherein the first layer of the coating has a thickness of from about 4-15 μm.

11. The cutting tool insert of claim 1,
wherein the cemented carbide body comprises about 5-9 wt-% Co.

12. The cutting tool insert of claim 1,
wherein the cemented carbide body comprises 7.5-9.5 wt-% cubic carbides of at least one metal selected from the group consisting of groups IVb, Vb and VIb of the periodic table.

13. The cutting tool insert of claim 1,
wherein the cemented carbide body comprises cubic carbides of at least one metal selected from the group consisting of Ti, Nb and Ta.

14. The cutting tool insert of claim 1,
wherein the cemented carbide body has a coercivity of about 10-15 kA/m.

15. The cutting tool insert of claim 1,
wherein the binder phase enriched surface zone has a thickness of about 5-30 μm.

16. The cutting tool insert of claim 1,
wherein the α-Al₂O₃ layer has a thickness of about 2-15 μm.

17. The cutting tool insert of claim 4,
wherein the first layer comprises Ti(C,N).

18. The cutting tool insert of claim 4,
wherein the first layer of the coating has a thickness of about 5-10 μm.

19. The cutting tool insert of claim 1,
wherein the α-Al₂O₃ layer has an $R_a$ value <0.7 μm.

20. The cutting tool insert of claim 6,
wherein the second layer has a thickness of about 0.5-1.5 μm; and
wherein the second layer has an $R_a$ value <about 0.5 μm.

* * * * *